United States Patent
Kim

Patent Number: 6,132,567
Date of Patent: Oct. 17, 2000

[54] FABRICATION METHOD OF AMORPHOUS LIGHT RARE EARTH-TRANSITION METAL AND METALLOID ALLOY FILMS

[75] Inventor: Jai-young Kim, Yongin, Rep. of Korea

[73] Assignee: Samsung Display Device Co., Ltd., Suwon, Rep. of Korea

[21] Appl. No.: 09/225,447

[22] Filed: Jan. 6, 1999

[30] Foreign Application Priority Data

Apr. 3, 1998 [KR] Rep. of Korea .............. 98-11891

[51] Int. Cl.⁷ .............................................. C23C 14/00
[52] U.S. Cl. ........................ 204/192.2; 204/192.15; 204/192.23
[58] Field of Search ................. 204/192.12, 192.15, 204/192.2, 192.23

[56] References Cited

U.S. PATENT DOCUMENTS 4,889,607  12/1989  Buschow ..................... 204/192.15
4,925,742  5/1990  Sugawara et al. ................ 428/692

Primary Examiner—Nam Nguyen
Assistant Examiner—Steven H. VerSteeg
Attorney, Agent, or Firm—Burns, Doane, Swecker & Mathis, LLP

[57] ABSTRACT

A method of making amorphous light rare-earth transition metal (LRE-TM)-metalloid alloys having perpendicular magneto anisotropy energy, is provided. In this method of making amorphous LRE-TM-metalloid alloys by depositing a metalloid on an LRE-TM by sputtering, the sign of a saturation magnetostriction constant of the alloy is made opposite to the sign of a stress by applying a different Ar sputtering pressure according to the sign of the saturation magnetostriction constant, in order to increase the effective perpendicular magneto anisotropy energy $K_{Ueff}$ containing the components of magneto elastic energy expressed by an expression $$-\frac{3}{2}\lambda_s \sigma$$

(here, $\lambda_s$ is the saturation magnetostriction constant, and $\sigma$ is the stress).

6 Claims, 2 Drawing Sheets

FABRICATION METHOD OF AMORPHOUS LIGHT RARE EARTH-TRANSITION METAL AND METALLOID ALLOY FILMS

This application claims priority under 35 U.S.C. §§119 and/or 365 to 98-11891 filed in Korea on Apr. 3, 1998; the entire content of which is hereby incorporated by reference.

BACKGROUND OF THE INVENTION

1. Field of the Invention

The present invention relates to a fabrication method of amorphous light rare earth-transition metal (LRE-TM) and metalloid alloy films, having uniaxial magnetic anisotropy energy perpendicular to the film planes.

2. Description of the Related Art

At present, an amorphous LRE-TM alloy has been highlighted as an information record-reproduction film material of a short wavelength magneto-optic recording media because of its characteristics in which the Kerr rotation angle increases in a short wavelength area.

In the prior art, an amorphous heavy rare-earth transition metal (HRE-TM) has been typically used as a recording film material of the red wavelength magneto-optic recording media. This HRE-TM alloy (e.g., TbFe) is mainly used as a red laser diode magneto-optic recording media because of its characteristics in which the Kerr rotation angle increases in a red laser wavelength. That is, as shown in the graph of FIG. 1, TbFe has an increasing Kerr rotation angle in a wavelength of 500 nm or more, thus it is appropriate as a red laser diode magneto-optic recording media having a wavelength between 600 nm and 700 nm. However, the recording density of the magneto-optic recording media is proportional to the square of the reciprocal of a laser wavelength. Thus, an improvement in the recording density requires use of a blue laser diode having a short wavelength. However, as shown in the graph of FIG. 1, TbFe increases the error generation rate due to its characteristics in which the Kerr rotation angle decreases in a blue laser wavelength.

In order to solve this problem, the LRE-TM alloy, which increases the Kerr rotation angle in a short wavelength area, has been highlighted as a recording film material of the magneto-optic recording media for a short wavelength. That is, as shown in the graph of FIG. 1, an amorphous NdFe metal alloy among LRE-TM alloys provides a high Kerr rotation angle in the short wavelength area, so it is appropriate as the recording film material of the magneto-optic recording media for a short wavelength. However, the LRE-TM alloy such as the NdFe alloy forms ferro-magnetic coupling between the magnetic moment of a light rare-earth metal and that of a transition metal, so it has much demagnetizing energy. Thus, the LRE-TM alloy does not have perpendicular magnetic anisotropy energy with respect to its plane but in-plane magnetic anisotropy energy, so that it cannot be used as a material for the recording film of the short-wavelength magneto-optic recording media.

SUMMARY OF THE INVENTION

To solve the above problem, it is an objective of the present invention to provide a method of making an alloy of a metalloid and a light rare earth-transition metal which increases magnetic anisotropy perpendicular to a film plane.

Accordingly, to achieve the above objective, there is provided a method of making light rare-earth transition metal-metalloid alloys by depositing a metalloid on a light rare earth-transition metal using a sputtering method, the method comprising the step of: making the sign of a saturation magnetostriction constant be opposite to the sign of a residual stress by applying a different sputtering pressure according to the sign of the saturation magnetostriction constant of the alloy among the components of magnetic elastic energy expressed by an expression $$-\frac{3}{2}\lambda_S \sigma,$$

in order to increase effective perpendicular magnetic anisotropy energy $K_{Ueff}$ expressed by the following Equation:

$$K_{Ueff} = K_U - K_{MS} + \left(-\frac{3}{2}\lambda_S \sigma\right)$$

wherein $K_U$ denotes uniaxial magnetic anisotropy energy, $K_{MS}$ denotes magneto static energy, $$-\frac{3}{2}\lambda_S \sigma$$

denotes the magneto elastic energy, $\lambda s$ denotes a saturation magnetostriction constant, and $\sigma$ denotes a residual stress.

In the present invention, preferably, when the saturation magnetostriction constant of the alloy is positive, a low sputtering pressure is applied so that the internal stress state of the alloy becomes a negative compression stress. It is preferable that when the saturation magnetostriction constant of the alloy is negative, a high sputtering pressure is applied so that the internal stress state of the alloy becomes a positive tensile stress.

Also, it is preferable that the light rare earth metal is selected from the lanthanum-series group consisting of Ce, Pr, Nd, Pm, Sm, Eu, and Gd, the transition metal is selected from the group consisting of Fe, Ni, and Co, and the metalloid is selected from the group consisting of B, Si, and P.

BRIEF DESCRIPTION OF THE DRAWINGS

The above objective and advantage of the present invention will become more apparent by describing in detail a preferred embodiment thereof with reference to the attached drawings in which.

DESCRIPTION OF THE PREFERRED EMBODIMENT

An amorphous light rare earth-transition metal (LRE-TM) alloy must have perpendicular magnetic anisotropy energy and simultaneously maintain a high Kerr rotation angle in a blue laser wavelength area, in order to be utilized as a magneto-optic recording media for a blue LD. In order for the amorphous LRE-TM alloy to simultaneously accomplish perpendicular magnetic anisotropy energy and a high Kerr rotation angle in a short wavelength, the present invention fundamentally proposes a method of reducing a diamagnetic field energy by decreasing the magnetic moment of a transition metal other than a light rare-earth metal in the amorphous LRE-TM alloy, and increasing the magneto elastic energy of the alloy. For this, the components of a typical perpendicular magnetic anisotropy energy are analyzed as follows.

$K_{Ueff}$=intrinsic magnetic anisotropy energy+extrinsic magnetic anisotropy energy
=$K_U$−$K_{MS}$+$K_{ME}$
=$K_U$−($2\pi M_S^2$)+(−$3/2\lambda s\sigma$)

$K_{Ueff}$: effective perpendicular magnetic anisotropy energy
$K_{MS}$: magneto static energy
$K_{ME}$: magneto elastic energy
$K_U$: uniaxial magnetic anisotropy energy
$M_S$: saturation magnetization
$\lambda s$: saturation magnetostriction
$\sigma$: residual stress That is, the effective perpendicular magnetic anisotropy energy $K_{Ueff}$, being the sum of the intrinsic magnetic anisotropy energy and the extrinsic magnetic anisotropy energy of an alloy, must be positive in order for the amorphous LRE-TM alloy to have perpendicular magnetic anisotropy energy. The intrinsic magnetic anisotropy energy is comprised of perpendicular crystal magnetic anisotropy energy having uniaxial magnetic anisotropy perpendicular to a film plane. On the other hand, the extrinsic magnetic anisotropy energy is comprised of the magneto static energy which decreases perpendicular magnetic anisotropy energy being the intrinsic magnetic anisotropy energy, and the magneto elastic energy which increases the perpendicular magnetic anisotropy energy. Accordingly, there are two types of methods by which the amorphous LRE-TM alloy can have the perpendicular magnetic anisotropy energy without a reduction in the Kerr rotation angle in a short wavelength laser area.

The first is a method of reducing the magneto static energy $K_{MS}(2\pi M_S^2)$.

The second is a method of maintaining the sign of the magneto elastic energy $$K_{ME}\left(-\frac{3}{2}\lambda_S\sigma\right)$$

to be positive.

The first method of reducing the magneto static energy to accomplish the effective perpendicular magnetic anisotropy energy of the alloy is performed by adding a metalloid to the amorphous LRE-TM alloy as proposed in U.S. patent application Ser. No. 08/738,837 by the present applicant.

Such a technique will now be described in more detail referring to the attached drawings.

Figure 1:
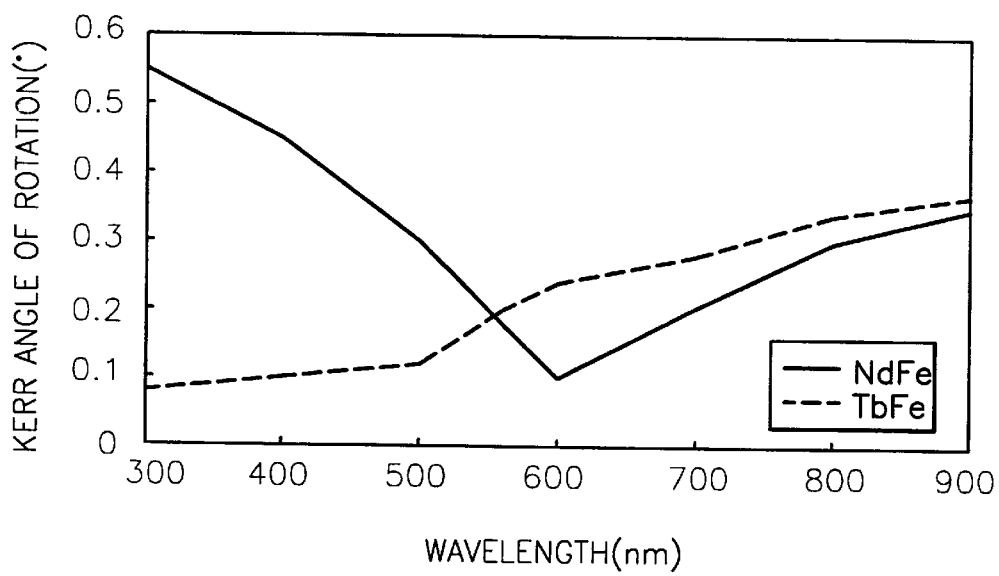
FIG. 1 is a graph illustrating variations in the Kerr rotation angle according to the wavelengths of an amorphous TbFe alloy and an amorphous NdFe alloy which are used as a conventional magneto-optic film material, wherein the TbFe alloy was measured in a direction perpendicular to a plane and the NdFe alloy was measured in an in-plane direction.
Figure 2:
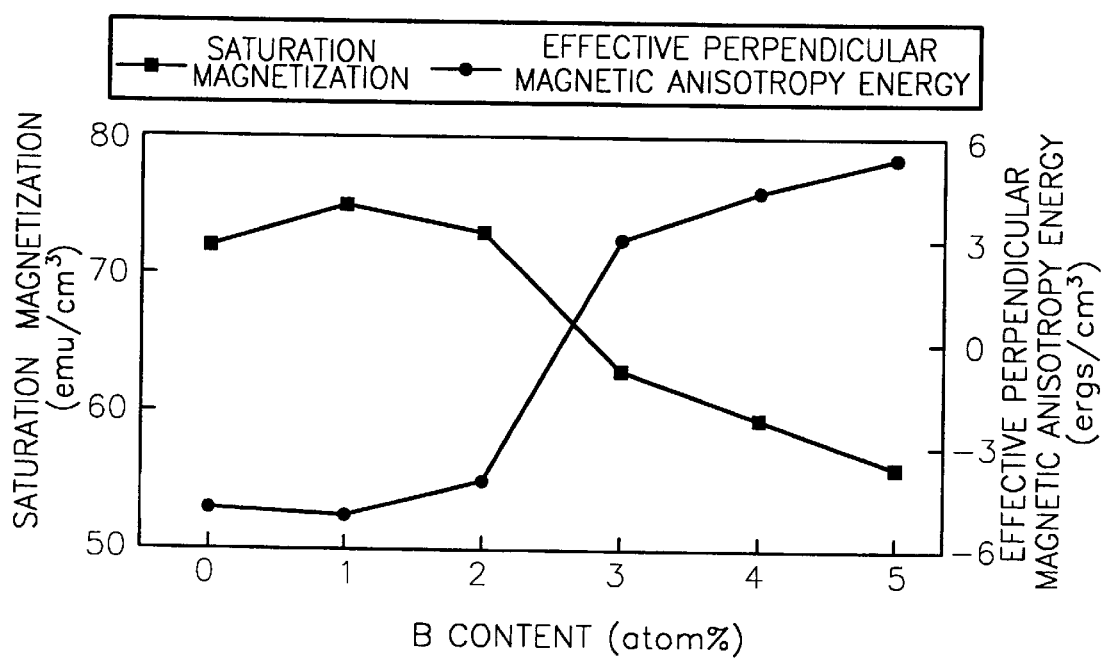
FIG. 2 is a graph illustrating variations in saturation magnetization and effective perpendicular magnetic anisotropy energy according to the amount of a metalloid which is added to an amorphous light rare earth-transition metal.

FIG. 2 is a graph illustrating variations in saturation magnetization and effective perpendicular magnetic anisotropy energy according to the amount of a metalloid which is added to an amorphous light rare-earth transition metal. As shown in the graph, when 2 to 3 atom % of a B metal is added to a NdFe metal, saturation magnetization of the NdFeB alloy decreases sharply. The reduction in saturation magnetization reduces the magneto static energy which decreases effective perpendicular magnetic anisotropy, and the effective perpendicular magnetic anisotropy energy increases with a decrease in the magneto static energy. The reason for the above-described phenomenon will be described as follows.

Free electrons emitted from a metalloid added to the LRE-TM are not coupled to a 4f orbit which determines the magnetic moment of the light rare-earth metal, but is coupled to a 3d orbit of the transition metal. This is because 5s, 5p and 5d orbits outside the 4f orbit of the light rare-earth metal function to protect, but there are no orbits, performing protection, outside the 3d orbit of the transition metal. Accordingly, as the free electrons emitted from the metalloid are combined with the 3d orbit of the transition metal, the magnetic moment of the transition metal is reduced, whereby the magnetic moment of the entire alloy is also reduced. As a consequence, the effective perpendicular magnetic anisotropy energy increases due to the reduction in the diamagnetic field of the entire alloy, and simultaneously has no influence on the 4f electron orbit of the light rare-earth metal, so that the Kerr rotation angle in a short wavelength area does not change.

The present invention takes the second method of increasing the magneto elastic energy, to increase the effective perpendicular magnetic anisotropy energy of the alloy. That is, since the uniaxial perpendicular magnetic anisotropy energy can increase or decrease depending on the sign of a saturation magnetostriction and the state of the residual stress, the magnetic elastic energy is increased by controlling the two above-described factors.

In the method of making an alloy of a LRE-TM and a metalloid by depositing the metalloid on the LRE-TM using a sputtering method among physical deposition methods, a magnetic elastic energy value must be kept positive to increase the perpendicular magnetic anisotropy energy including the magnetic elastic energy expressed by the expression $$-\frac{3}{2}\lambda_S\sigma$$

($\lambda_s$ is a saturation 2 magnetostriction constant and $\sigma$ is a residual stress). For this, the sign of the saturation magnetostriction constant must be different from the sign of the residual stress to increase.

In general, compression stress is negative, and tensile stress is positive. Accordingly, when the saturation magnetostriction constant of the amorphous alloy is positive, a compression stress is applied, but when the saturation magnetostriction constant is negative, a tensile stress is applied. In this way, the magnetic elastic energy can be kept positive values.

As described above, the second method is characterized by including the step of differently converting the pressure for sputtering according to the sign of the saturation magnetostriction constant of the alloy to make the sign of the saturation magnetostriction constant be opposite to the sign of the residual stress. This will be described in more detail as follows.

The sputtering method among physical deposition methods (PVD) is used to thinly deposit the alloy of an amorphous LRE-TM metal and a metalloid. That is, an alloy target of an LRE-TM alloy and a metalloid is made by adding the metalloid to the LRE-TM alloy. Ar gas is implanted into a vacuum chamber, to which a high voltage is applied, having the alloy target of the LRE-TM and the metalloid, and the inert Ar gas is made into a plasma state. Then, Ar gas ions having high energy collides with the target, and the target material such as atoms or ions projects out of the target due to the collision energy. Thus, the target material is deposited to be a thin film. In this case, a different Ar sputtering pressure is applied according to the saturation magnetostriction constant of the alloy to induce a positive magnetic elastic energy for increasing the effective perpendicular magnetic anisotropy energy. That is, when the saturation magnetostriction constant of the alloy is positive, a low Ar sputtering pressure is applied so that the internal stress of the alloy can be a compression stress. When the saturation magnetostriction constant of the alloy is negative, a high Ar sputtering pressure is applied so that the internal stress of the alloy can be a tensile stress. As described above, the magnetic elastic energy becomes positive to increase the effective perpendicular magnetic anisotropy energy, by selectively applying the compression stress or the tensile stress to the alloy according to the sign of the saturation magnetostriction constant of the alloy during thin film deposition of the alloy.

Figure 3:
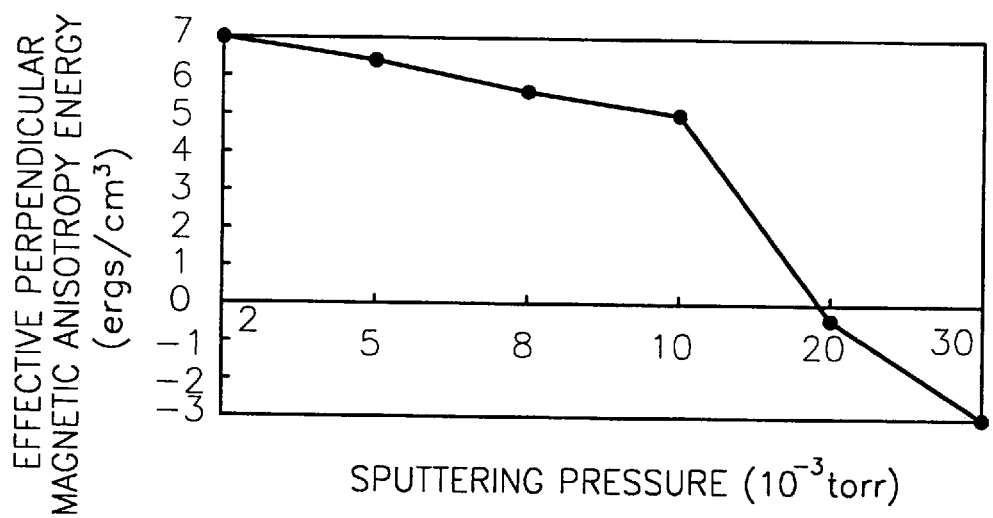
FIG. 3 is a graph illustrating the variation in the effective perpendicular magnetic anisotropy energy according to an Ar sputtering pressure in a method of making an alloy of a metalloid and an amorphous light rare earth-transition metal according to the present invention.

FIG. 3 is a graph illustrating the variation in the effective perpendicular magnetic anisotropy energy according to an Ar sputtering pressure in a method of making an alloy of a metalloid and an amorphous light rare earth-transition metal alloy according to the present invention. As shown in the graph, the perpendicular magnetic anisotropy energy increases with a decrease in an Ar sputtering pressure. That is, since the saturation magnetostriction constant of the amorphous NdFeB alloy is positive, the magnetic elastic energy is positive when the amorphous NdFeB alloy is deposited with a low Ar sputtering pressure and a compression stress is applied to the thin film. Therefore, the perpendicular magnetic anisotropy energy of the entire alloy is increased.

Figure 4:
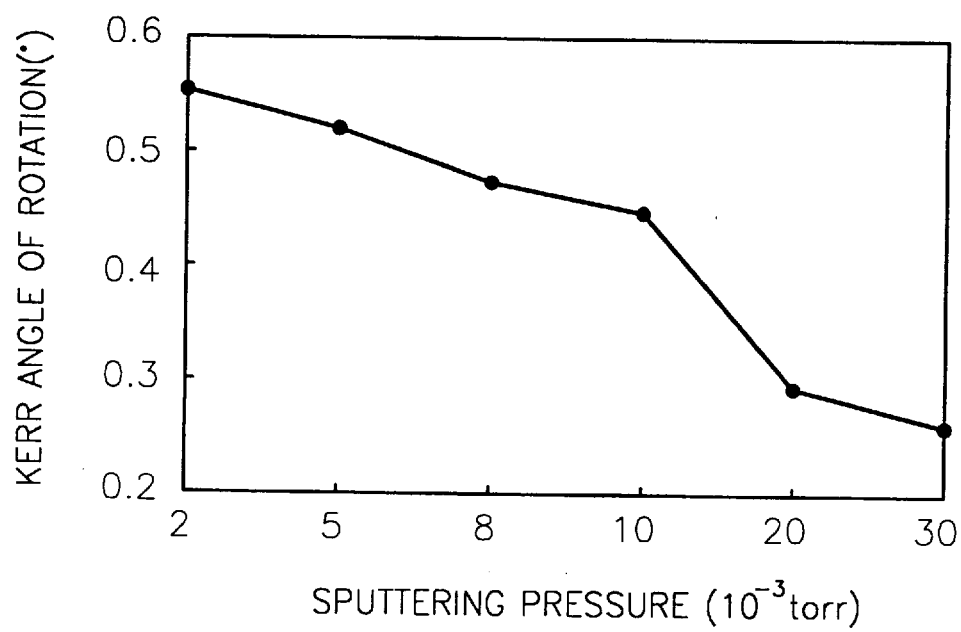
FIG. 4 is a graph illustrating the variation in the angle of Kerr rotation according to an Ar sputtering pressure in a method of making an alloy of a metalloid and an amorphous light rare earth-transition metal according to the present invention.

FIG. 4 is a graph illustrating the variation in the Kerr rotation angle according to an Ar sputtering pressure in a method of making amorphous LRE-TM-metalloid alloys (NdFeB alloys) according to the present invention. Here, a used laser wavelength is 400 nm. As shown in this graph, the Kerr rotation angle the amorphous LRE-TM-metalloid alloys increases with a decrease in the Ar sputtering angle. That is, since the saturation magnetostriction constant of the amorphous NdFeB alloy is positive, the magnetic elastic energy increases when the amorphous NdFeB alloy is deposited with a low Ar sputtering pressure and a compression stress is applied to the thin film. Therefore, the total perpendicular magnetic anisotropy energy of the alloy is increased. Also, the Kerr rotation angle of the amorphous NdFeB alloy made with a low Ar sputtering pressure increased in proportion to the increased perpendicular magnetic anisotropy energy.

On the other hand, in the case of SmFeB alloy being an amorphous LRE-TM-metalloid alloy having a negative saturation magnetostriction constant, when it is deposited with a high Ar sputtering pressure, a residual stress of the thin film is a positive tensile stress. Accordingly, the magnetic elastic energy of the thin film becomes positive, and thus the total perpendicular magnetic anisotropy energy of the alloy increases.

In the amorphous LRE-TM-metalloid alloy and the method of making the same according to the present invention, a different Ar sputtering pressure is applied according to the sign of the saturation magnetostriction constant of the alloy, to thus increase the perpendicular magnetic anisotropy energy. Therefore, the alloy can be used as a recording film material in a magneto-optic recording media for a blue laser diode.

What is claimed is:

1. A method of making amorphous light rare earth-transition metal-metalloid alloys by depositing a metalloid on a light rare earth-transition metal alloy using a sputtering method, the method comprising the step of:

sputter depositing the metalloid by making the sign of a saturation magnetostriction constant be opposite to the sign of a residual stress by applying a different sputtering pressure according to the sign of the saturation magnetostriction constant of the alloy among the components of magneto elastic energy expressed by an expression $$-\frac{3}{2}\lambda_S \sigma,$$

in order to increase effective perpendicular magneto anisotropy energy $K_{Ueff}$ expressed by the following Equation:

$$K_{Ueff} = K_U - K_{MS} + \left(-\frac{3}{2}\lambda_S \sigma\right)$$

wherein $K_U$ denotes uniaxial magneto anisotropy energy, $K_{MS}$ denotes magneto static energy, $$-\frac{3}{2}\lambda_S \sigma$$

denotes the magneto elastic energy, $\lambda_s$ denotes a saturation magnetostriction constant, and $\sigma$ denotes a residual stress.

2. The method of making light rare earth-transition metal-metalloid alloys as claimed in claim 1, wherein when the saturation magnetostriction constant of the alloy is positive, a low sputtering pressure is applied so that the internal stress state of the alloy becomes a negative compression stress.

3. The method of making light rare earth-transition metal-metalloid alloys as claimed in claim 1, wherein when the saturation magnetostriction constant of the alloy is negative, a high sputtering pressure is applied so that the internal stress state of the alloy becomes a positive tensile stress.

4. The method of making light rare earth-transition metal-metalloid alloys as claimed in claim 1, wherein the light rare earth metal is selected from the lanthanum-series group consisting of Ce, Pr, Nd, Pm, Sm, Eu, and Gd.

5. The method of making light rare earth-transition metal-metalloid alloys as claimed in claim 1, wherein the transition metal is selected from the group consisting of Fe, Ni, and Co.

6. The method of making light rare earth-transition metal-metalloid alloys as claimed in claim 1, wherein the metalloid is selected from the group consisting of B, Si, and P.

* * * * *